(12) United States Patent
Nawaz

(10) Patent No.: US 7,898,040 B2
(45) Date of Patent: Mar. 1, 2011

(54) DUAL GATE FINFET

(75) Inventor: Muhammad Nawaz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 218 days.

(21) Appl. No.: 11/764,535

(22) Filed: Jun. 18, 2007

(65) Prior Publication Data

US 2008/0308861 A1   Dec. 18, 2008

(51) Int. Cl.
*H01L 29/78* (2006.01)

(52) U.S. Cl. .................. 257/401; 257/288; 257/213; 257/327; 257/E29.264

(58) Field of Classification Search .......... 257/327, 257/401, E29.264, E21.421, 213, 288
See application file for complete search history.

(56) References Cited

U.S. PATENT DOCUMENTS

| 6,867,460 | B1 | 3/2005 | Anderson et al. | |
| 2005/0019993 | A1* | 1/2005 | Lee et al. | 438/157 |
| 2005/0145941 | A1* | 7/2005 | Bedell et al. | 257/348 |
| 2006/0292781 | A1 | 12/2006 | Lee | |
| 2007/0045736 | A1 | 3/2007 | Yagishita | |
| 2007/0054448 | A1* | 3/2007 | Choi et al. | 438/201 |
| 2008/0067613 | A1* | 3/2008 | Anderson et al. | 257/401 |
| 2008/0251779 | A1* | 10/2008 | Kakoschke et al. | 257/5 |

* cited by examiner

*Primary Examiner*—Cuong Q Nguyen
*Assistant Examiner*—Trang Q Tran
(74) *Attorney, Agent, or Firm*—Schwegman Lundberg & Woessner, P.A.

(57) ABSTRACT

A circuit has a fin supported by a substrate. A source is formed at a first end of the fin and a drain is formed at a second end of the fin. A pair of independently accessible gates are laterally spaced along the fin between the source and the drain. Each gate is formed around approximately three sides of the fin.

22 Claims, 7 Drawing Sheets

DUAL GATE FINFET

BACKGROUND

Integrated circuit device performance in the sub 100 nm range is often limited by short-channel effects. Such short-channel effects make further scaling difficult if not impossible. These effects are usually manifested as a reduction in transconductance, an increase in output conductance and a shift in the threshold voltage as transistor gate length is reduced.

Another manifestation of short channel effects is an increase in the sub-threshold current. For low power or for high performance applications, tight control on the sub-threshold drain current and threshold voltage is needed. Challenges to the source-drain doping and requirement for scaled ultra shallow junctions which demand adequate doping abruptness with high doping activation, may be a major limiting barrier to technology development beyond the 65 nm range.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Figure 1A:
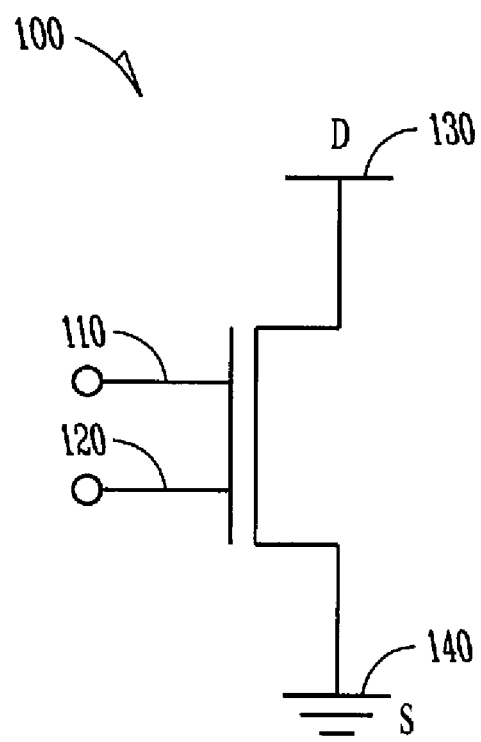
FIG. 1A is a circuit diagram of a dual gate FinFET (Fin type Field Effect Transistor) according to an example embodiment.

FIG. 1A is a circuit diagram of a dual gate FinFET (Fin type Field Effect Transistor) 100 according to an example embodiment. A first gate 110 and a second gate 120 are coupled to a channel between a drain 130 and source 140. In one embodiment, the gates 110 and 120 are independently accessible. Dual gate FinFET 100 is a three dimensional vertical structure as shown in further figures.

Dual gate FinFET 100 may be used for many applications, including RF analog applications such as variable gain amplifiers, oscillators, phase shifters, attenuators, and mixers. A dual gate design approach offers possible advantages over conventional tetrode MOS (metal oxide semiconductor) structures, such as reduced Miller feedback capacitance and output conductance. The reduced feedback and resulting increase in power gain and stability, in conjunction with the increased functional capability stemming from the presence of two independent control gates 110 and 120 allows tuning to different threshold voltage requirements.

In one embodiment, different gate lengths may be used to tune the threshold requirements. By controlling biasing of electrodes, a single gate FinFET device can be used in a variety of signal transfer functions in a compact form. Different combinations of biasing on the two gates for the dual gate FinFET may be used to provide different nonlinear characteristic. Moreover, the dual gate FinFET 100 design offers intrinsic separation of signal and local oscillator ports (helpful in Mixer applications) and separate by easer matching and direct combination of the corresponding powers inside the device.

Figure 1B:
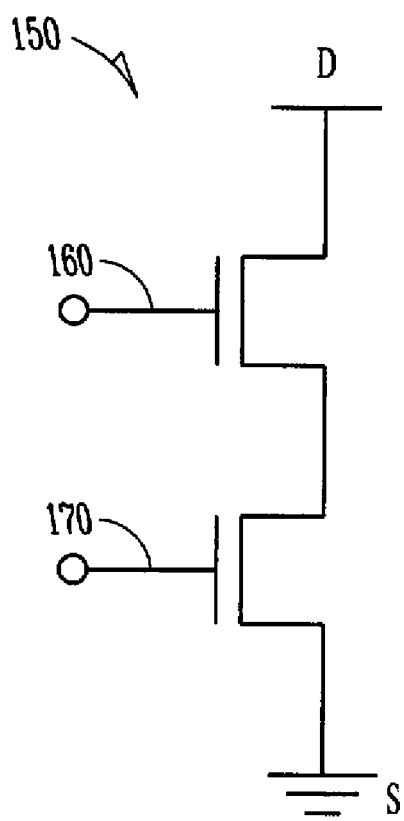
FIG. 1B is a circuit diagram of a single dual gate Fin FET device with two equivalent series connected single gate FinFETs according to an example embodiment.

FIG. 1A is a symbolic representation of a single dual gate FinFET device with two independent gates sitting side by side, where one gate may be used for RF signal input and the other gate may be used for a local oscillator port. Decomposition of a single dual gate Fin FET device with two equivalent series connected single gate FinFETs is shown in FIG. 1B at 150 with gates 160 and 170.

Figure 2:
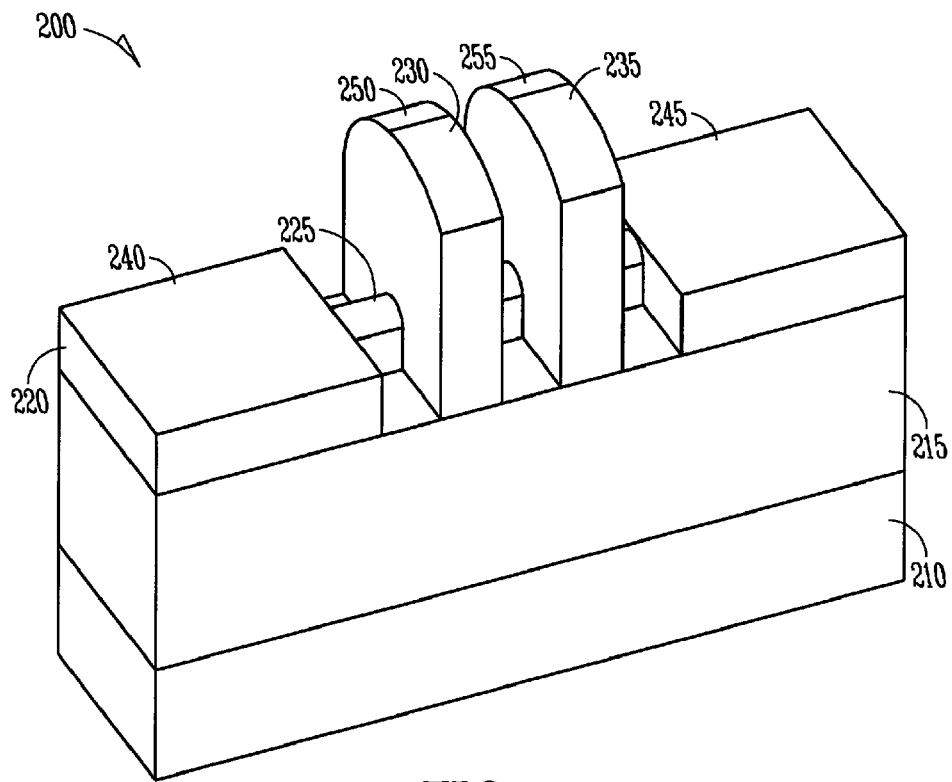
FIG. 2 is a perspective internal view of a dual gate FinFET according to an example embodiment.

FIG. 2 is a perspective view of a partially formed dual gate FinFET 200 according to an example embodiment. In one embodiment, a p-type silicon substrate 210 has a buried oxide layer 215 formed thereon along with a top silicon FinFET body 220. FinFET body 220 includes a fin 225. In one or more embodiments, the fin 225 is supported by the buried oxide layer 215 or other type of insulator for electrical isolation. In one or more embodiments, the fin 225 is a narrow fin-shaped structure having a width to height ratio or aspect ratio that may vary depending on desired characteristics. Typical dimensions for the fins in current embodiments may be in the range of 5 to 100 nms, but may vary significantly in future embodiments as processing techniques progress.

Figure 3:
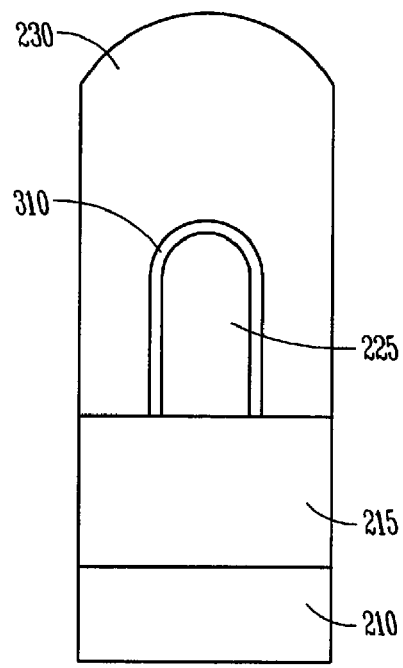
FIG. 3 is a cross section of a gate of the partially formed dual gate FinFET according to an example embodiment.

Electrical isolation of the fin may also be provided by a space-charge region if the fins are formed on a bulk silicon substrate. A gate dielectric 310 (shown in cross section in FIG. 3) is formed over the top and sidewall surfaces of the fins 225. The gate dielectric 310 may, for example, be a thermally grown oxide of $SiO_2$ or a high-K material like $TaO_5$, $HFO_2$ or any other gate dielectric material. In one embodiment the gate dielectric 310 layer is 1-3 nm thick.

Gate electrodes 230 and 235 are formed over the top and sidewall surfaces of the gate dielectric 310 and may include a metal layer. The gates surround the fin 225 on at least approximately three sides, including the top and sidewall surfaces of the fin 225 giving rise to the term multigate FET or MugFET. Gate electrodes 230 and 235 may be deposited polysilicon or any other suitable material with a desired work function, such as metal. In one or more embodiments of the invention, the gate electrodes 230 and 235 may comprise any conductive material. In one or more embodiments of the invention, the two gate electrodes may be identical. In one or more embodiments of the invention, the two gate electrodes may be different. In one or more embodiments of the invention, the two gate electrodes 230 and 235 may be formed of different materials. In one or more embodiments, the two gate electrodes 230 and 235 may have different gate lengths (where the gate length is generally the length of the fin that is surrounded by a gate electrode). In one or more embodiments, it is possible that the oxide layer 310 underlying one of the gate electrodes have a different thickness from the oxide layer 310 underlying the other gate electrodes.

Referring again to FIG. 3, it is noted that in one or more embodiments of the invention, an additional dielectric material, such as an oxide or a nitride, may be formed over the top surface of the dielectric 310. This additional dielectric material may provide additional electrical isolation between the top surface of the fin 225 and the gate electrode 230 (and/or between the top surface of the fin 225 and the gate electrode 235 shown in FIG. 2). Doping of the FinFET body 220 (including the fin 225) may include p-type and/or n-type doping, which along with gate work function (which may at least partially be defined by the gate material) may at least partially define the threshold voltage of the device.

In one or more embodiments of the invention, the FinFET body 220 may also include a wide source region 240 and a wide drain region 245. The wide source region 240 and the wide drain region 245 may, optionally, be formed to extend the source and drain regions (which may also be part of the fin 225) beyond the ends of the fin 225.

Hence, in one or more embodiments of the invention, a source region may be formed that extends from approximately the gate 230 to the end of wide source region 240. Likewise, a drain region may be formed that extends from approximately the gate 235 to the end of the drain region 245. In another embodiment of the invention, a FinFET body may be formed that includes the fin 225 but that does not include the wide source region 240 or the wide drain region 245. In this case, the source and drain regions may be formed so that they are only included as part of the fin 225.

Figure 4:
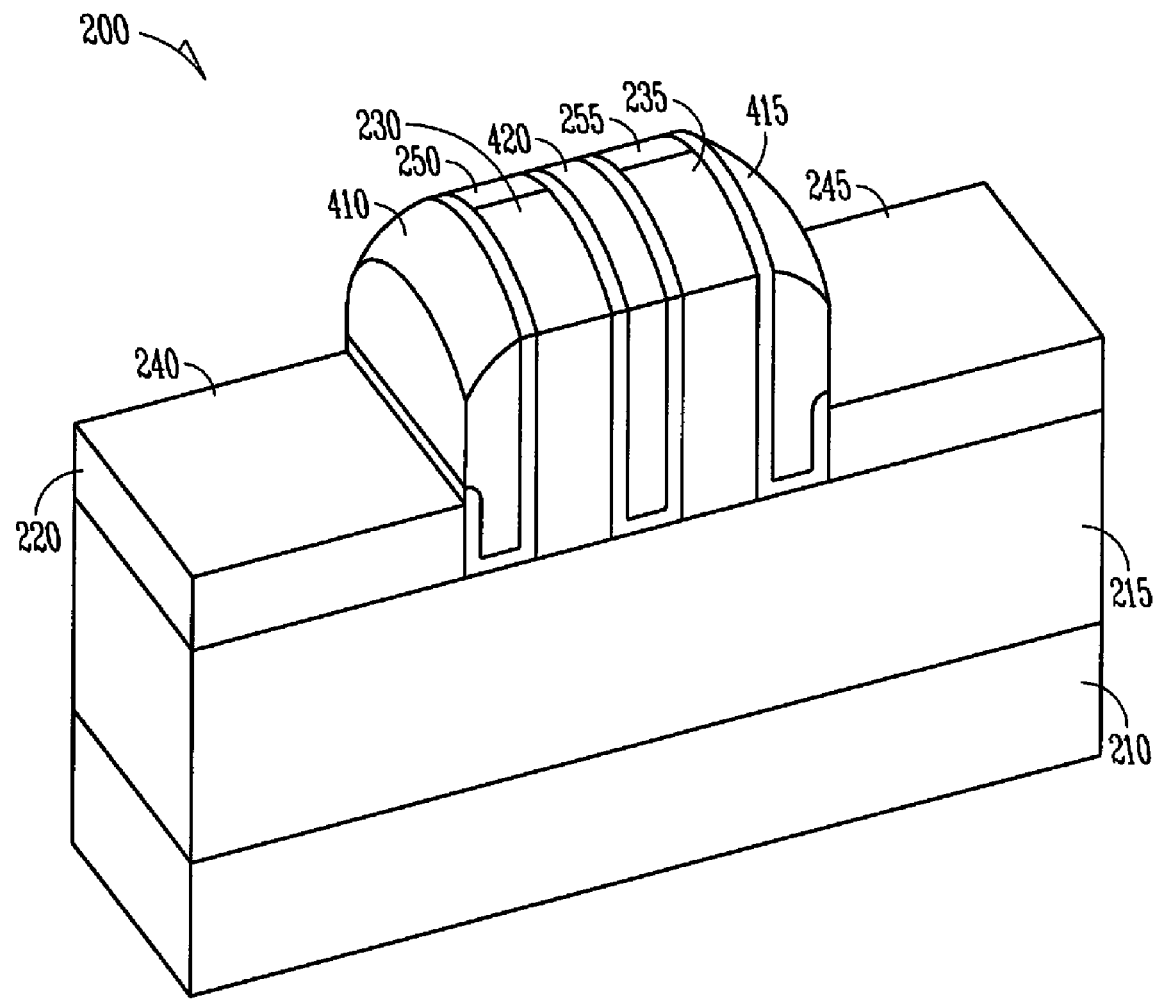
FIG. 4 is a perspective view of a dual gate FinFET according to an example embodiment.

In the embodiment shown, the wide source and drain regions 240, 245 are wider than fin 225. The wide source and drain regions 240, 245 may serve as landing pads for source and drain electrical contacts or electrodes. The source and drain regions, including the wide source region 240 and wide drain region 245, may be implanted with an n-type dopant such as As (arsenic) for nFinFETs or they may be implanted with a p-type dopant such as B (boron) for pFinFETs. The region between the two gates 230 and 235 may be covered with a suitable mask during such a source-drain doping process. Oxide and/or nitride spacer layers 410 and 415 may be formed, such as by deposition around the gate region, as seen in FIG. 4. In one embodiment, the spacers may be nitride spacers and may have a thickness ranging from about 25 nm to about 75 nm. A region 420 between the gates 230 and 235 may also be filled with a suitable dielectric such as $Si_3N_4$.

A source-drain implant step may then be performed to form source and drain regions of the device. The source-drain implant may be an n-type dopant such as As for nFinFETs or p-type dopant such as B for pFinFETs. Other suitable dopants may also be used in different embodiments. Source and drain metal contact layers respectively may be disposed over the wide source region 240 and wide drain region 245, respectively. Many different suitable conductive materials may be used. Gate contact layers 250 and 255 may then be formed such as by deposition on the gate electrodes. In one embodiment, the gate contact layers are formed of conductive metal. The gate contact layers 250 and 255 may be coupled to other circuitry providing independent access to the two gates.

Figure 5:
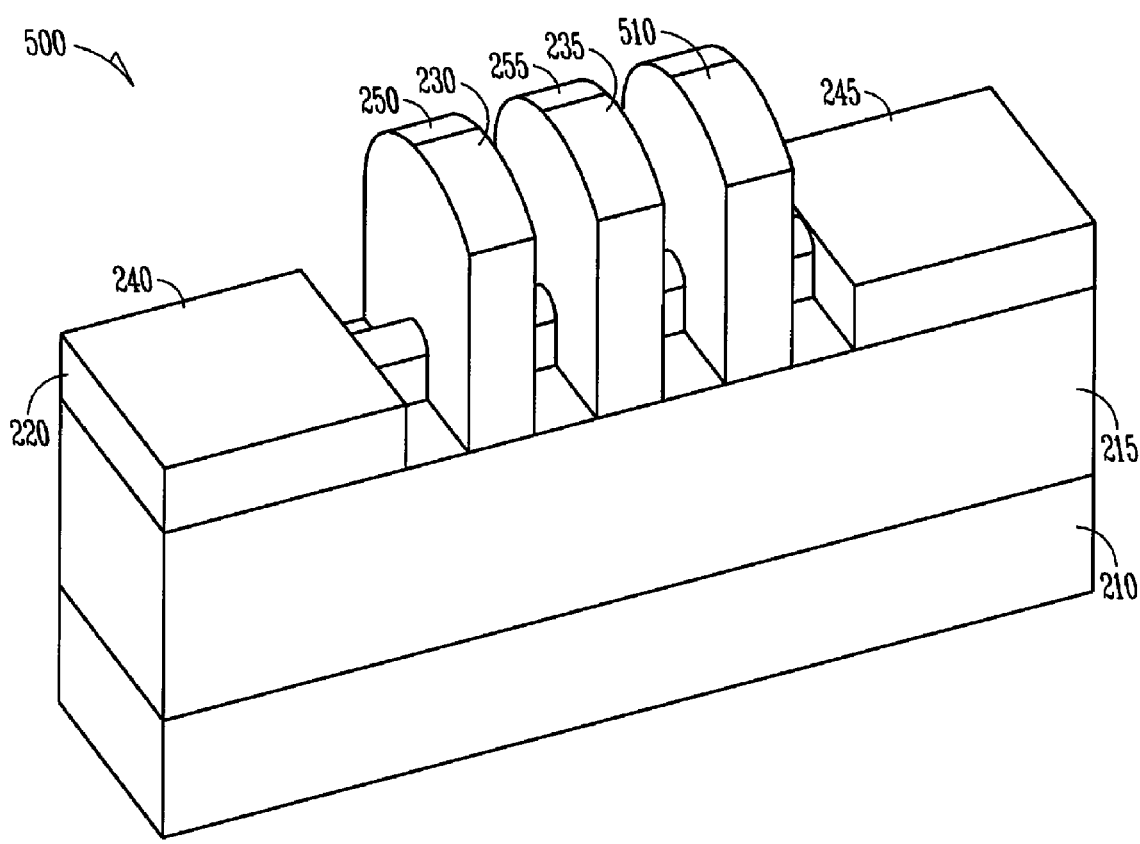
FIG. 5 is a perspective internal view of a triple gate FinFET according to an example embodiment.

FIG. 5 is a perspective view of a partially formed triple gate FinFET according to an example embodiment. A third gate 510 is formed about fin 225 adjacent but separated from gate 235. The third gate provides even greater flexibility in designing transistors with desired characteristics. Gate length and work function may also be modified on third gate 510 to obtain such desired characteristics. In further embodiments, additional gates may be added.

Figure 6A:
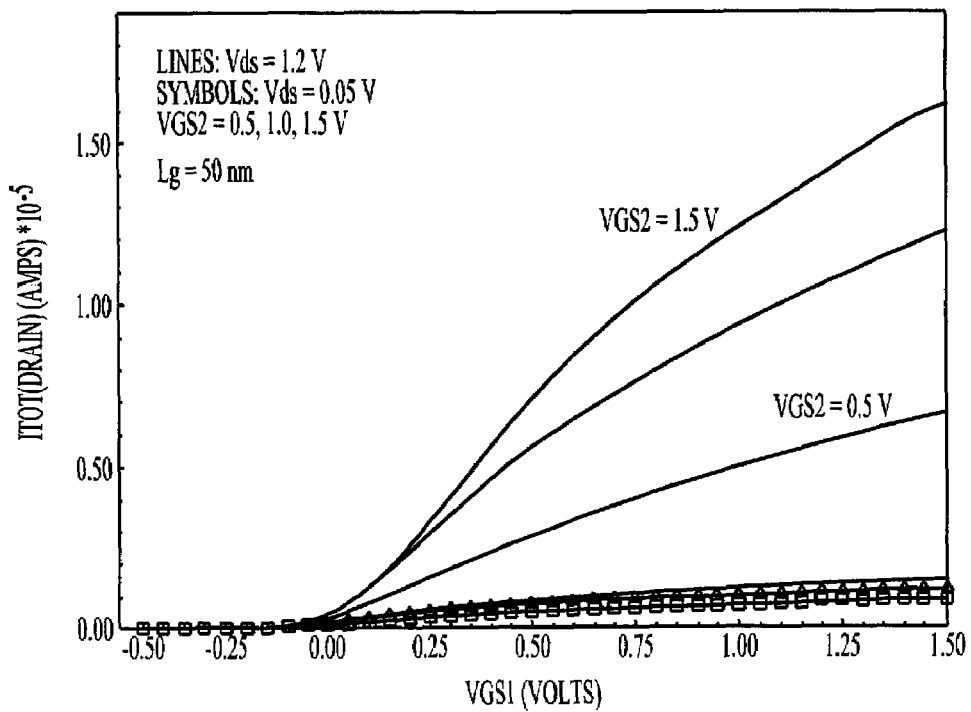
FIGS. 6A and 6B are example graphs of simulated current-voltage (I-V) characteristics of a 50 nm dual gate FinFET with 50 nm spacing between the gates according to an example embodiment.
Figure 6B:
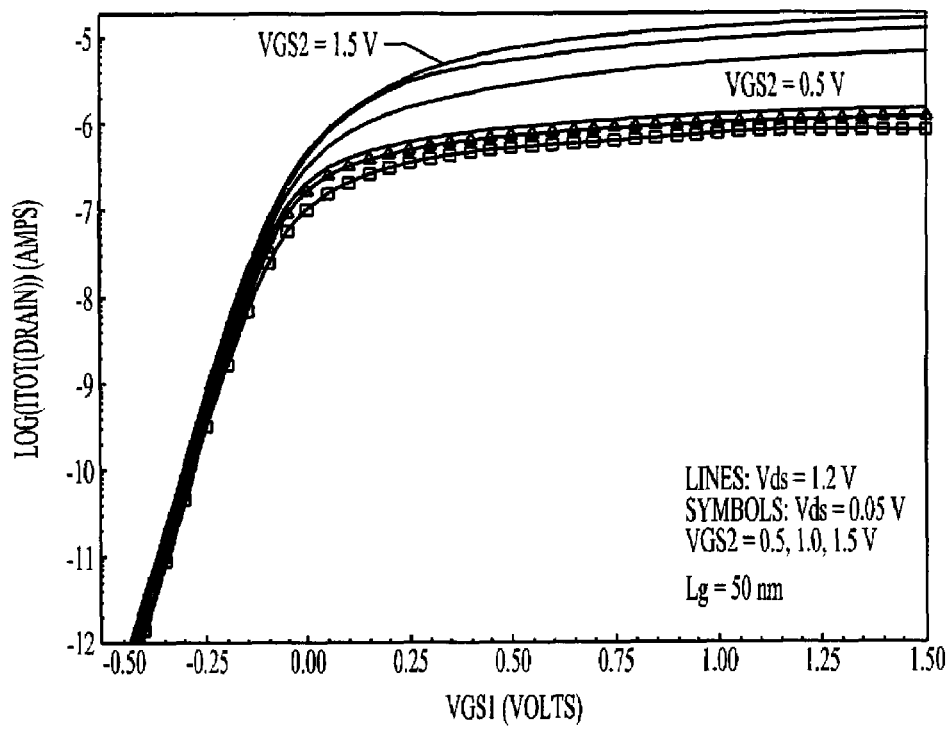

FIGS. 6A and 6B are example graphs of simulated current-voltage (I-V) characteristics of a 50 nm dual gate FinFET with 50 nm spacing between the gates. FIG. 6A has a linear scale for current and FIG. 6B has a logarithmic scale. At a fixed drain bias and ramping the voltage at a first gate, the threshold voltage of the device can be varied which is more sensitive with spacing between the gates. The on-current of the device increases with an increase of voltage at the second gate. The FinFET device is at different second gate biases in linear (Vds=0.05 V) and saturation region (Vds=1.2 V) of device operation.

Figure 7A:
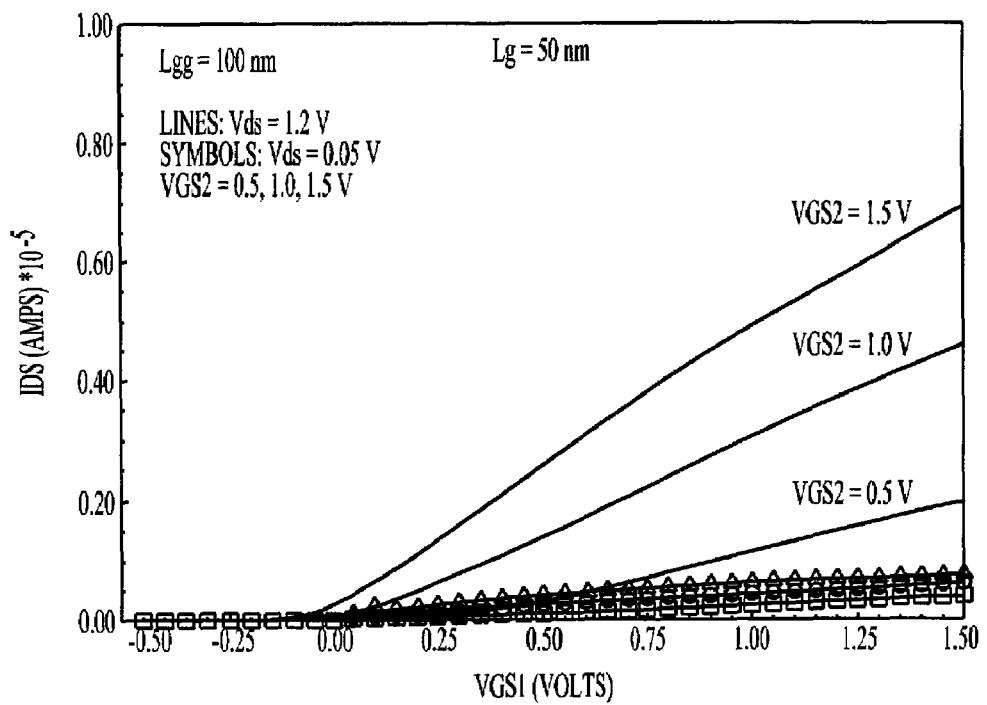
FIGS. 7A and 7B are example graphs of simulated I-V characteristics of a 50 nm dual gate FinFET with an increased spacing of 100 nm between the gates according to an example embodiment.
Figure 7B:
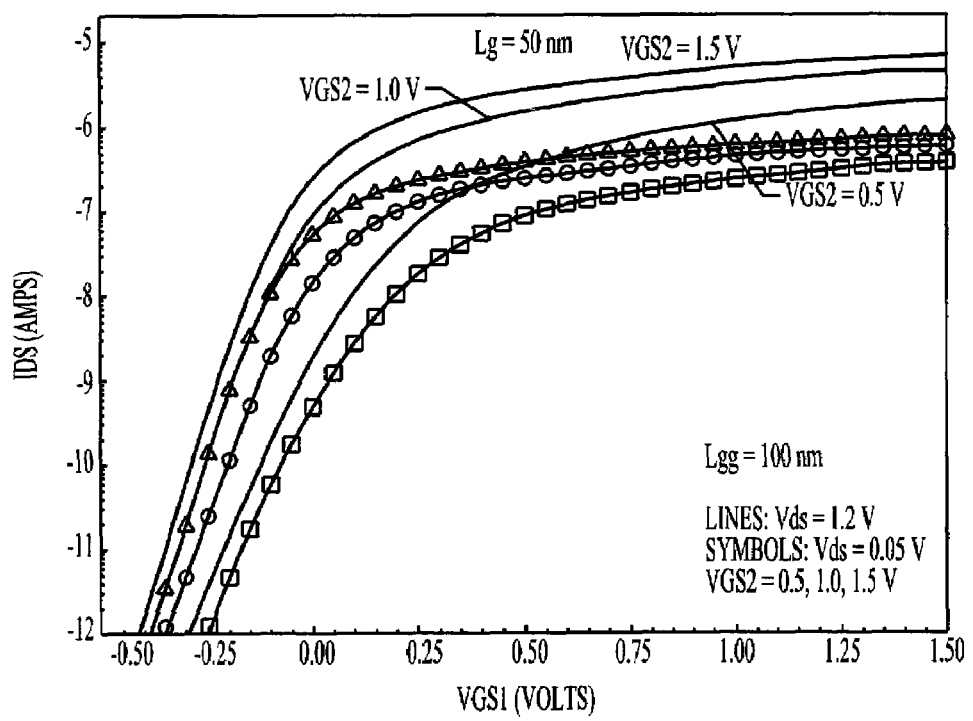

FIGS. 7A and 7B are example graphs of simulated I-V characteristics of a 50 nm dual gate FinFET with an increased spacing of 100 nm between the gates. FIG. 7A has a linear scale for current and FIG. 7B has a logarithmic scale. The FinFET device is at different second gate biases in linear (Vds=0.05 V) and saturation region (Vds=1.2 V) of device operation.

Figure 8A:
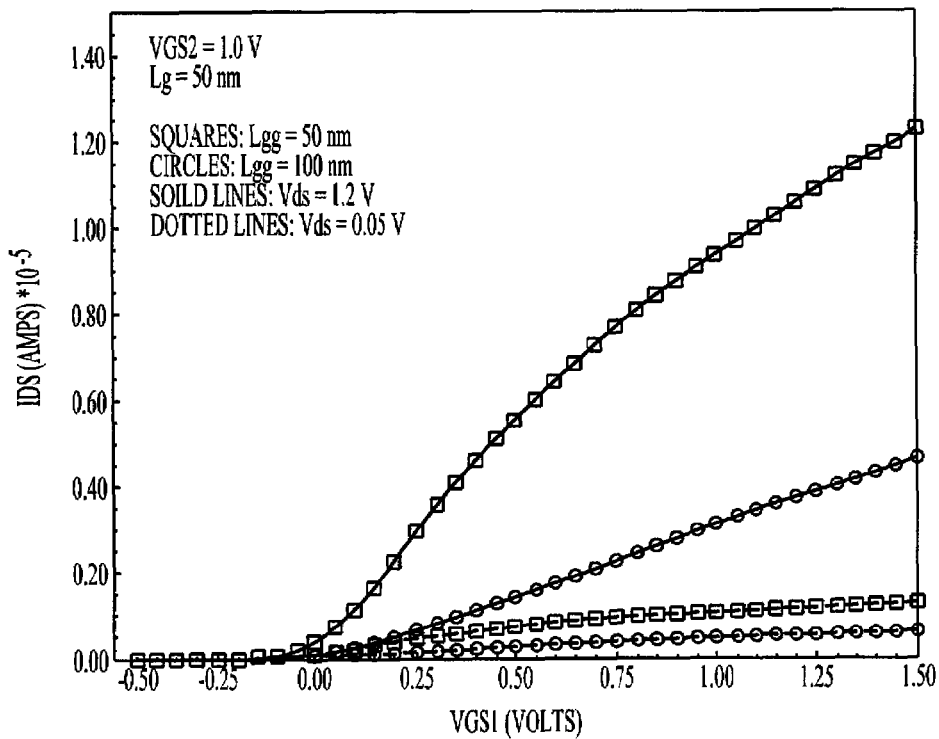
FIGS. 8A and 8B are example graphs of simulated I-V characteristics of a 50 nm dual gate FinFET with different gate spacings of 50 nm and 100 nm according to an example embodiment.
Figure 8B:
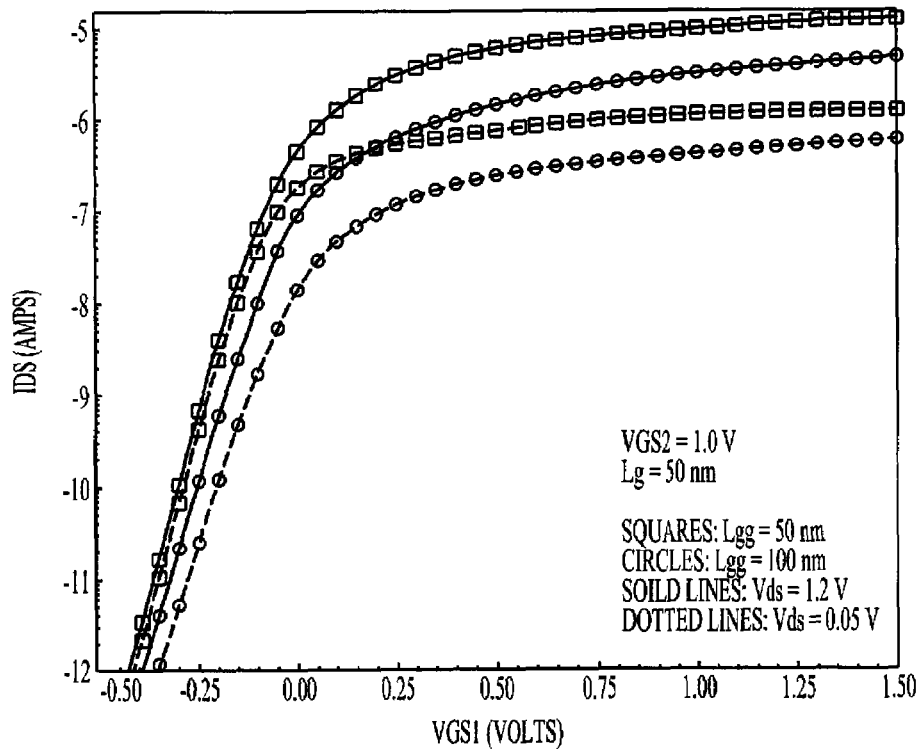

A comparison of different spacing (squares represent 50 nm spacing, circles represent 100 nm spacing) between two gates is shown in FIGS. 8A (linear scale) and 8B (logarithmic scale). In the example graphs of simulated I-V characteristics, the dual gate FinFET has gates of 50 nms. The on-current of the device increases with an increase of voltage at the second gate. The FinFET device is at different second gate biases in linear (Vds=0.05 V) and saturation region (Vds=1.2 V) of device operation.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

What is claimed is:

1. A circuit comprising:
   a substrate;
   a fin supported above the substrate;
   a source region formed at a first end of the fin;
   a drain region formed at a second end of the fin; and
   a pair of independently accessible gates laterally spaced along the fin between the source region and the drain region, each of the independently accessible gates formed over a dielectric layer, wherein the dielectric layer formed around approximately three sides of the fin.

2. The circuit of claim 1 and further comprising a third independently accessible gate laterally spaced with the pair of gates along the fin between the source and the drain and formed around approximately three sides of the fin.

3. The circuit of claim 1 wherein the gates are separated from each other by a dielectric material.

4. The circuit of claim 1 and further comprising a buried oxide layer on top of the substrate wherein the fin is formed on top of the buried oxide layer.

5. The circuit of claim 1 wherein the gates have different lengths.

6. The circuit of claim 1 wherein the gates each have a different work function.

7. A device comprising:
   a substrate;
   a fin insulated from and supported by the substrate;

a source formed at a first end of the fin;

a drain formed at a second end of the fin;

multiple independently accessible gates laterally spaced along the fin between the source and the drain, each of the gates formed over a dielectric layer wherein the dielectric layer formed around approximately three sides of the fin.

8. The device of claim 7 wherein there are two or three independently accessible gates.

9. The device of claim 7 wherein the gates have different lengths.

10. The device of claim 7 wherein the gates are formed of different materials and have different work functions from each other.

11. The device of claim 7 and further comprising a buried oxide layer between the substrate and the fin to provide electrical isolation of the fin from the substrate, and wherein the substrate is formed of silicon.

12. The device of claim 7 wherein the source, drain and gates have contacts formed thereon.

13. A FinFET device, comprising:

a substrate;

a fin supported by the substrate; and a plurality of independently accessible gates laterally spaced along the fin, each of said gates formed over a dielectric layer wherein the dielectric layer formed around approximately three sides of the fin.

14. The device of claim 13, wherein said fin includes a source region and a drain region, each of said plurality of gates disposed between said source region and said drain region.

15. The device of claim 13, wherein each of said gates overlies the sidewall and top surfaces of the fin.

16. A circuit comprising:

a substrate;

a fin supported above the substrate;

a source region formed at a first end of the fin;

a drain region formed at a second end of the fin; and a pair of independently accessible gates laterally spaced along the fin between the source region and the drain region, each gate of the pair of the independently accessible gates formed over a dielectric layer the fin and comprising a gate electrode to receive a different gate bias from the other wherein the dielectric layer formed around approximately three sides of the fin.

17. The circuit of claim 16, wherein the gate electrodes of the pair of independently accessible gates comprise different materials from each other.

18. The circuit of claim 16, wherein the length of the fin surrounded by the gate electrode of a corresponding one of the pair of independently accessible gates is different from the other.

19. The circuit of claim 16, wherein the thickness of the dielectric layer underlying a corresponding one of the pair of the independently accessible gates is different from the other.

20. The circuit of claim 16, further comprising at least one of a wide source region and a wide drain region, the wide source region and the wide drain region each being wider than the fin and extending beyond the first end and the second end, respectively.

21. The circuit of claim 16, wherein the dielectric layer comprises $TaO_5$ or $HFO_2$.

22. The circuit of claim 16, further comprising an additional dielectric layer formed between the top surface of the dielectric layer and the gates, the additional dielectric layer comprising a nitride.

* * * * *

UNITED STATES PATENT AND TRADEMARK OFFICE
CERTIFICATE OF CORRECTION

| | |
|---|---|
| PATENT NO. | : 7,898,040 B2 |
| APPLICATION NO. | : 11/764535 |
| DATED | : March 1, 2011 |
| INVENTOR(S) | : Muhammad Nawaz |

It is certified that error appears in the above-identified patent and that said Letters Patent is hereby corrected as shown below:

In column 5, line 5, in Claim 7, before "wherein" delete "layer" and insert -- layer, --, therefor.

In column 5, line 27, in Claim 13, before "wherein" delete "layer" and insert -- layer, --, therefor.

In column 6, line 11, in Claim 16, delete "other" and insert -- other, --, therefor.

Signed and Sealed this
Tenth Day of May, 2011

David J. Kappos
*Director of the United States Patent and Trademark Office*